(12) United States Patent
Hong (10) Patent No.: US 7,879,631 B2
(45) Date of Patent: Feb. 1, 2011

(54) SYSTEMS AND METHODS FOR ON-DIE LIGHT SENSING WITH LOW LEAKAGE

(76) Inventor: Jim T. Hong, 5708 Marilyn Dr., Austin, TX (US) 78757

( * ) Notice: Subject to any disclaimer, the term of this patent is extended or adjusted under 35 U.S.C. 154(b) by 1135 days.

(21) Appl. No.: 11/588,198

(22) Filed: Oct. 24, 2006

(65) Prior Publication Data

US 2008/0166826 A1  Jul. 10, 2008

(51) Int. Cl.
  *H01L 21/00*  (2006.01)
(52) U.S. Cl. ............... 438/29; 438/30; 438/34; 438/35; 250/214.1; 359/350
(58) Field of Classification Search ............ None
  See application file for complete search history.

(56) References Cited

U.S. PATENT DOCUMENTS

| 4,395,629 | A | * | 7/1983 | Sasano et al. | 250/226 |
|---|---|---|---|---|---|
| 4,667,092 | A | * | 5/1987 | Ishihara | 250/216 |
| 4,764,670 | A | * | 8/1988 | Pace et al. | 250/226 |
| 5,371,397 | A | * | 12/1994 | Maegawa et al. | 257/432 |
| 6,030,852 | A | * | 2/2000 | Sano et al. | 438/69 |
| 6,104,021 | A | * | 8/2000 | Ogawa | 250/208.1 |
| 6,255,640 | B1 | * | 7/2001 | Endo et al. | 250/208.1 |
| 6,504,188 | B1 | * | 1/2003 | Maruyama et al. | 257/222 |
| 6,630,722 | B1 | * | 10/2003 | Aoki | 257/435 |
| 6,900,084 | B1 | * | 5/2005 | Yamazaki | 438/158 |
| 7,002,647 | B2 | * | 2/2006 | Tanaka | 349/107 |
| 7,064,405 | B2 | * | 6/2006 | Kondo et al. | 257/436 |
| 7,075,164 | B2 | * | 7/2006 | Uya | 257/431 |
| 7,087,945 | B2 | * | 8/2006 | Nakai et al. | 257/294 |
| 7,253,399 | B2 | * | 8/2007 | Sakoh et al. | 250/239 |
| 7,482,186 | B2 | * | 1/2009 | Teng et al. | 438/29 |
| 7,560,674 | B2 | * | 7/2009 | Han | 250/200 |
| 7,683,302 | B2 | * | 3/2010 | Yokozawa | 250/208.1 |
| 2005/0190142 | A1 | | 9/2005 | Ferguson | |

* cited by examiner

*Primary Examiner*—Zandra Smith
*Assistant Examiner*—Khanh B Duong
(74) *Attorney, Agent, or Firm*—Tran & Associates (57) ABSTRACT

Systems and methods are disclosed for fabricating a device by forming a photosensitive area on a wafer; forming a control circuit adjacent the photosensitive area; and coating the photosensitive area with one or more film layers to form an optical filter. The filter provides a reduced leakage of an undesired wavelength onto the photosensitive area.

18 Claims, 9 Drawing Sheets

Etch a trench for the control circuitry

FIG. 1 (PRIOR ART)

| Form an ambient light sensing circuit on a wafer (10) |
|---|
| Form photo sensor adjacent the circuit (12) |
| Coat the circuit and the photo sensor with one or more film layers without long wavelength leakage (14) |

FIG. 2

| Form ambient light sensing circuit on a wafer (20) |
|---|
| Form photo sensor adjacent the ambient light sensing circuit (22) |
| Coat the circuit and the photo sensor with one or more film layers with a wide spectrum (24) |

FIG. 3

Form ambient light sensing circuit on a wafer (30)

Form photo sensor adjacent the ambient light sensing circuit and spaced at a sufficient distance from the ambient light sensing circuit (32)

Coat the ambient light sensing circuit and the photo sensor with one or more film layers without long wavelength leakage (34)

Use mask to block out unwanted light at edges

Etch a trench for the control circuitry

SYSTEMS AND METHODS FOR ON-DIE LIGHT SENSING WITH LOW LEAKAGE

The present invention relates to a circuit to accurately sense the brightness of a wavelength or set of wavelengths of electromagnetic radiation, with reduced sensitivity to unwanted wavelengths.

Backlight is needed to illuminate a screen to make a visible display in liquid crystal display (LCD) applications. The ability to read the display is hampered under conditions of high ambient room lighting. Ambient lighting reflects off the surface of the LCD and adds a bias to the light produced by the LCD, which reduces the display contrast to give the LCD a washed-out appearance. The condition can be improved by increasing the brightness of the backlight for the LCD, thereby making the light provided by the LCD brighter in comparison to the reflected light off the LCD surface. Thus, the backlight should be adjusted to be brighter for high ambient lighting conditions and less bright for low ambient lighting conditions to maintain consistent perceived brightness.

Additionally, as noted in US Application Serial No. 20050190142, in battery operated systems, such as cellular telephones and notebook computers, it is desirable to reduce power consumption and extend the run time on a battery between charges. One method of reducing power consumption, and therefore extending battery run time, is to reduce the backlight brightness of a LCD under low ambient lighting conditions. The backlight can operate at a lower brightness level for low ambient lighting conditions because light reflections caused by the ambient light are lower and produce less of a washed-out effect. It is also advantageous to turn down the backlight under low ambient lighting conditions to extend the life of light sources in the backlight system. Typically, the light sources have a longer lifetime between failures if they run at lower brightness levels.

For these applications, it is necessary to sense certain range of light according to a required spectrum that defines a specific optical transmittance pattern. For example, in order to automatically control the display brightness of mobile phone, PC monitor, TV screen, and instrument panels (such as automobile), among others, ambient light sensing is therefore required. Typically, an ambient light sensor (ALS) is used in a closed-loop configuration to adjust the backlight level in response to the ambient light level.

In addition to sensing ambient light, other optical sensors are also used. For accurate color representation, the relative brightness of red, green, and blue pixels must be accurately controlled. This balance can be achieved with a R sensor, G sensor, and B sensor. Other applications include laser light sensors for wireless networking and communications, as well as other applications.

Traditionally, the above functions are achieved by making an integrated circuit (IC) that contains a photosensitive device, and a sensor circuit. A thin film optical coating is then performed on a glass substrate to make an optical filter according to the applications. The coated glass is then cut and mounted on the IC. However, the final product is not only bulky that cannot be used in mobile devices such as cell phones. Further, such product is also labor intensive.

Recently, the optical coatings have been applied directly onto the IC wafer to provide ALS and other functionality. However, these devices suffer from leakage in undesired wavelengths, generally infrared (long wavelength) leakage in ambient light sensors. This generates unwanted voltages, and degrades the ability of the circuit to accurately sense the desired wavelengths.

SUMMARY

In one aspect, systems and methods are disclosed for fabricating a device by forming a photosensitive area on a wafer; forming a control circuit adjacent the photosensitive area; and coating the photosensitive area with one or more film layers to form an optical filter. The filter provides a reduced leakage of an undesired wavelength onto the photosensitive area.

Implementations of the above aspect may include one or more of the following. The leakage can be reduced by minimizing a topology on and near the photosensitive area. The desired wavelength can include visible light, and the undesired leakage can be an infrared wavelength. The desired wavelength corresponds to one of: red light, green light, blue light and the undesired wavelength can be all remaining frequencies detectable by the photosensitive area. The filter selectively passes the desired wavelength(s) and rejects wavelength(s) outside a sensitivity range of the photosensitive area. A separation distance can be provided between the photosensitive area and adjacent circuitry. The separation distance avoids a shadow effect created by circuit topology. The one or more film layers between the control circuit and the photosensitive area form a groove between two planar film layer portions, where the photosensitive area is positioned under one of the planar portions. A voltage gain of the photosensitive area can be increased to compensate for a reduced photosensitive area. Nonplanar topology at one or more edges of the photosensitive area can be reduced or eliminated. The photosensitive area can be placed at the same height as the control circuit. This can be done by etching a wafer surface beneath the control circuit to position the photosensitive area at the same height as the control circuit, or alternatively can be done by padding an area under the photosensitive area to elevate the photosensitive area to the same height as the control circuit. An opaque layer can be generated at one or more edges of the photosensitive area. The opaque layer blocks an area of non-planar topology near or within the photosensitive area. The opaque layer consists of a deposited metal. The metal is deposited during semiconductor fabrication.

In another aspect, an integrated circuit (IC) device includes a control circuit formed on a wafer; a photosensitive area formed adjacent the control circuit; and a coating deposited above the photosensitive area having one or more film layers forming an optical filter, said filter providing a reduced leakage of an undesired wavelength onto the photosensitive area.

In yet another aspect, a method fabricates a photosensitive circuit by forming a photosensitive area on a wafer; forming a control circuit nearby; and coating the photosensitive area with one or more film layers in such a way that greatly reduces sensitivity to unwanted wavelengths of electromagnetic radiation.

In yet another aspect, an integrated circuit (IC) device includes a photosensitive area; a control circuit; and a coating deposited above the photosensitive area such that the photosensitive area has a greatly reduced sensitivity to unwanted wavelengths of electromagnetic radiation.

Implementations of the above aspects may include one or more of the following. Unwanted wavelengths can be infrared frequencies. Unwanted wavelengths can consist of everything except one of red, blue, or green colors. Unwanted wavelengths can consist of an arbitrary set of wavelengths specified by the device designer. The film layers can have a spectrum covering a wide range of wavelengths. The coating can provide a reflection zone from between approximately 700 nm to approximately 2400 nm. A separation distance between the ambient light sensing circuit and the light sensor can be provided. The separation distance avoids a shadow effect. A groove may be present between the photosensitive area and surrounding circuitry, and the effective photosensitive area may be restricted or moved in several ways to lie outside the topology created by this groove. The effective photosensitive area may be limited to a planar region by use of an opaque layer covering nonplanar topology. This opaque layer can consist of a metal deposited during the fabrication process. This metal can be aluminum, copper, or other suitable metal. The voltage gain of the light sensor can be increased to offset the reduced photo or light sensor area. The light sensor can be positioned at the same height as the surrounding circuitry. The wafer surface beneath the ambient light sensing circuit can be etched to position the light sensor at the same height as the ambient light sensing circuit. An area under the light sensor can be padded to elevate the light sensor to the same height as the ambient light sensing circuit.

For the purposes of summarizing the invention, certain aspects, advantages and novel features of the invention have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

BRIEF DESCRIPTION OF THE DRAWINGS

FIG. 1 shows an exemplary conventional ALS device, while FIG. 1B shows exemplary paths of light through a coating on the ALS device.

DESCRIPTION

Figure 1:
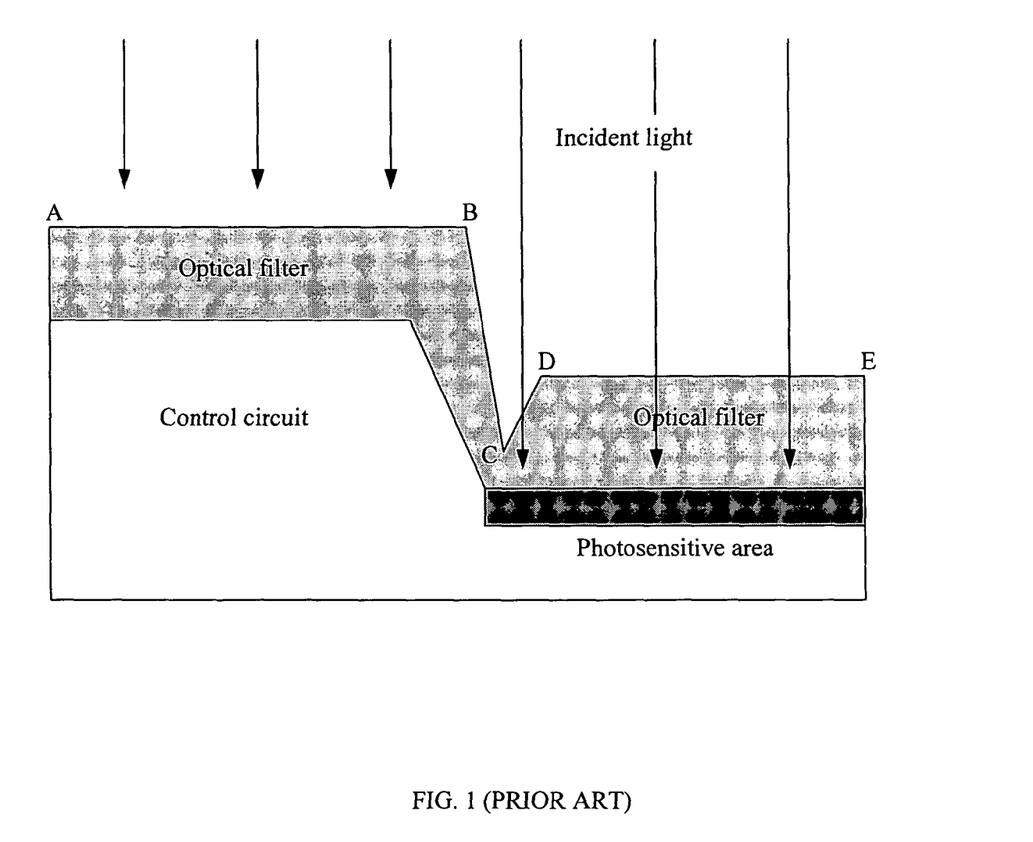

FIG. 1 shows a conventional ALS structure. In general, the ALS includes a light (or a suitable form of electromagnetic radiation) sensor. The sensor consists of a photosensitive area and a control circuit. An optical coating is generally deposited above the photosensitive area and the control circuit. Due to the fabrication process, the control circuit is generally positioned above the photosensitive area, with a slope separating the control circuit and the photo sensitive area. The differential position or height between the control circuit and the photo-sensitive area causes undesirable leakage to occur, which in turn causes the photosensitive area to misdetect ambient light. FIG. 1 shows that the conventional topology distorts the optical filter at points BC and CD. This allows unwanted wavelengths of light to pass.

To address the undesirable leakage, embodiments of the present invention discussed below present a planar surface to incident light over the photosensitive area. The more planar this surface, the better the properties of the resulting device. In general, the interior areas of the photosensitive area 1 are well planarized. However, areas with circuitry or other structures nearby such as the control circuit 2 usually have nonplanar geometry. This geometry causes the optical coating 4 on top to change its properties, transmitting and reflecting the wrong wavelengths. Described below are several methods of eliminating distortion due to undesired geometry usually near the edges of the photosensitive area.

Figure 2:
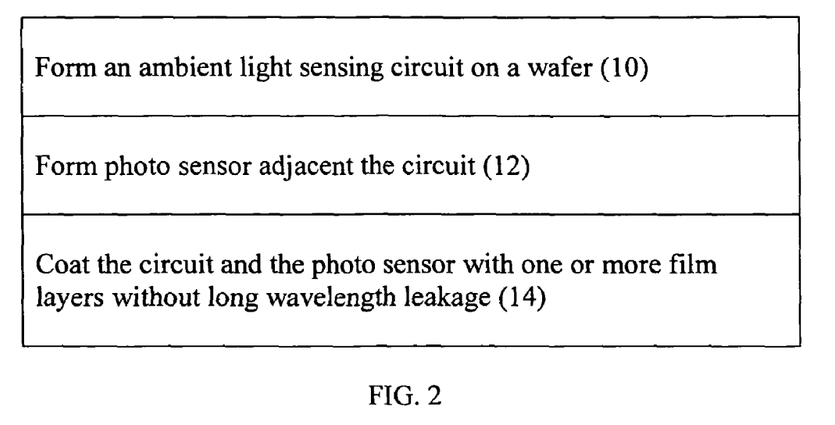
FIG. 2 shows a first exemplary process for fabricating a device with ALS.

Embodiments of the present invention will be described hereinafter with reference to the drawings. FIG. 2 shows a first exemplary process for fabricating a device with light sensitivity in the desired wavelengths and minimal leakage elsewhere. The process forms a control circuit on a wafer (10). Simultaneously or in sequence, the process forms a photo or light sensor adjacent the control circuit (12). The process then coats the circuit and the photo or light sensor with one or more film layers designed to act as an optical filter. This filter is tuned to transmit desired wavelengths of light, and reflect undesired wavelengths. (14) In this implementation, leakage of incident light due to edge effects is greatly reduced.

Figure 3:
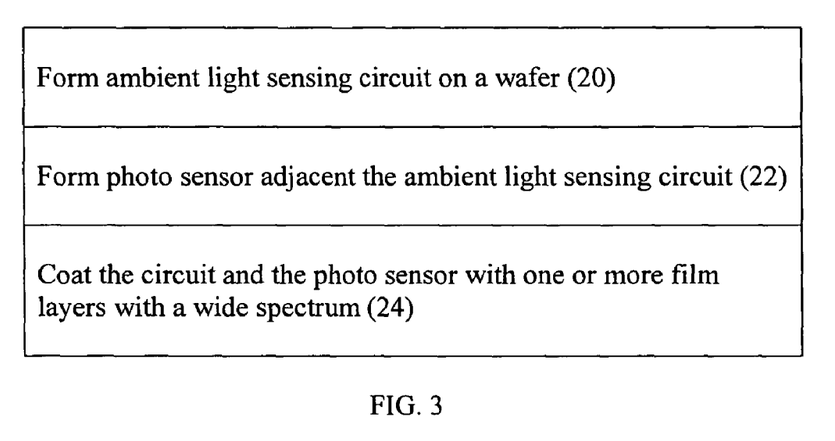
FIG. 3 shows a second exemplary process for fabricating a device with ALS.

FIG. 3 shows a second exemplary process for fabricating a device with ALS. Similar to the process of FIG. 2, the process forms an ambient light sensing circuit on a wafer (20) and forms an ambient light sensor adjacent the display circuit (22). The process then coats the sensing circuit and the ambient light sensor with one or more film layers with a wide spectrum (24).

In one embodiment of FIG. 3, the coating's spectrum covers a wide range of wavelengths. For example, the coating design extends the reflection zone from 700 nm-1200 nm to 700 nm-2400 nm for the ALS.

Figure 4:
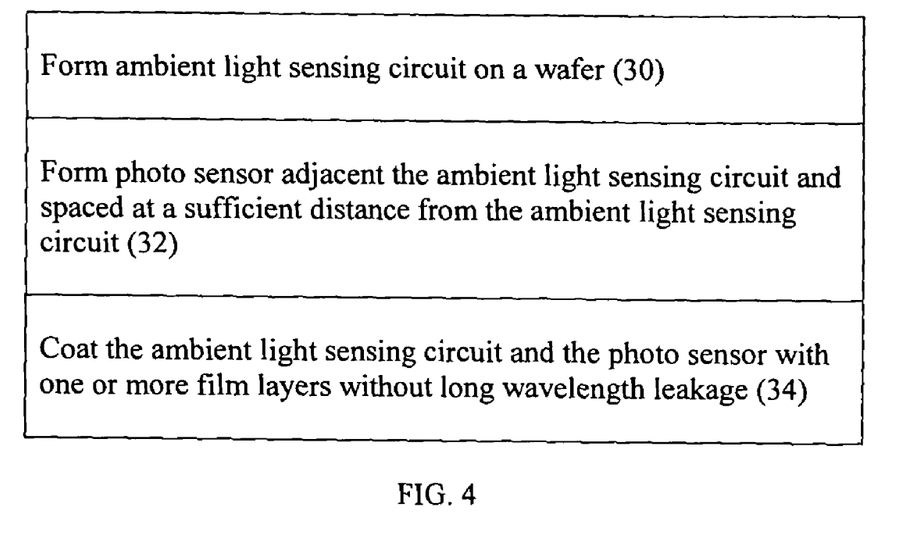
FIG. 4 shows a third exemplary process for fabricating a device with ALS.

FIG. 4 shows a third exemplary process for fabricating a device with ALS. First, the process forms an ambient light sensing circuit on a wafer (30). Next, the process forms an ambient light sensor adjacent the display circuit and spaced at a sufficient distance from the sensing circuit (32). The process then coats the sensing circuit and the ambient light sensor with one or more film layers without long wavelength leakage (34).

Figure 7:
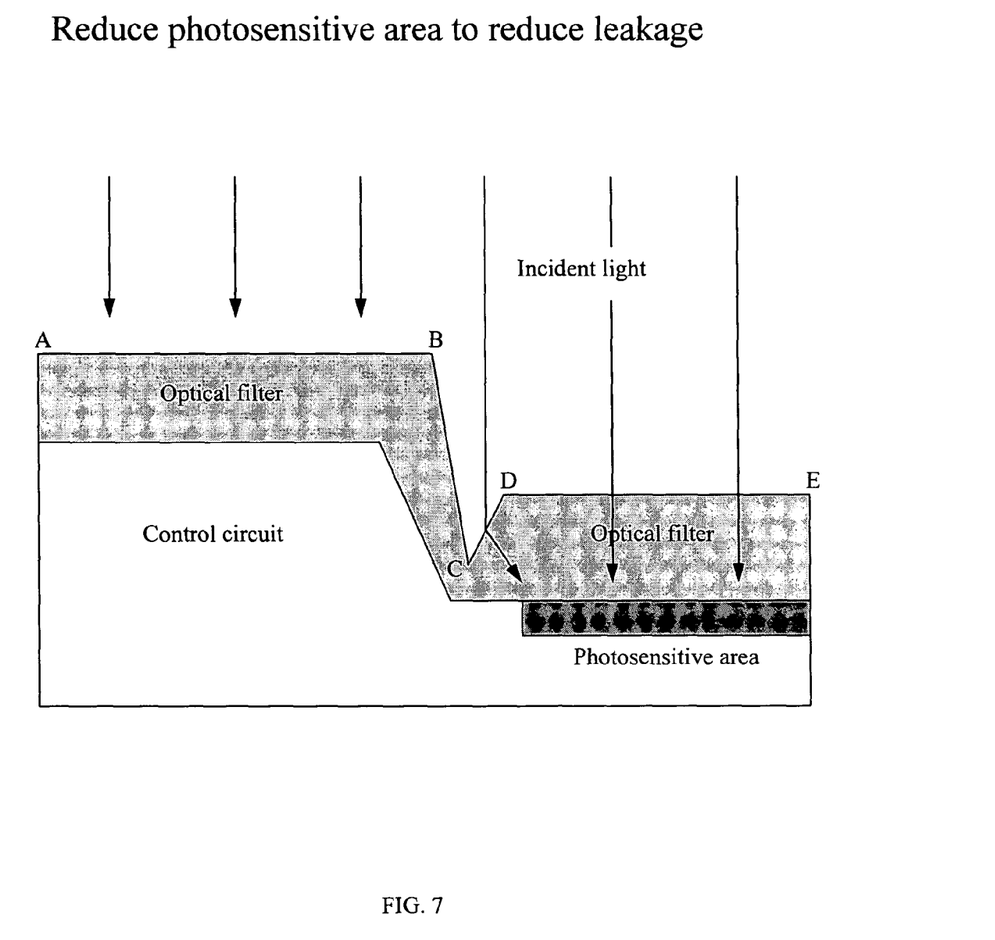
FIGS. 7-11 show various exemplary cross sectional views of ALS device embodiments formed in accordance with the present invention.

FIG. 7 shows an exemplary cross section view of a photo sensing IC or device formed according to the process of FIG. 4. The photo sensing IC contains a photo sensing area under the light sensor and a circuit area under the ambient light sensing circuit. While the photo sensing can be a layer of photo sensing material to convert light into voltage, the circuit area is a multi layer structure. Therefore the circuit area is several microns higher than the photo sensing area with a relatively steep slope as shown in FIG. 1 where surface AB is the circuit area, BC and CD is the slope, and DE is the photo sensing area.

During thin film optical coating, coating material cannot reach points around C. That is, point C is under the shadow of the slope BD. In the photo sensing area, the closer to point C, the thinner the coating thickness. Thus a new surface is formed after first layer of optical coating. A new slope is formed to the right side of point C. This new slope in turns generates another shadow around C for coating material coming an oblique angle from top right path. Due to the accumulated effect of both shallows, the slope CD becomes steeper and steeper after many layers is coated. For example, the total layers are around 40 for the RGB color filters and 60 or 70 for ALS. These layers are formed by alternatively coating a plurality of materials, each with a different thickness, and either constructive interference or destructive interference is performed to generate the desired spectrum. These two types of material is the n high material such as $TiO_2$, $Ta_2O_5$, or $Nb_2O_5$ and the n low material is usually $SiO_2$ where n is the diffraction index, When the coating is finished, the final surface ABCDE is shown in FIG. 7 where a deep groove BCD is formed around point C. It is the slope CD that generates the long wavelength leakage. This means that undesirable long wavelength transmittance zone can leak into the zone detected by the light sensor, ultimately generating unwanted voltage.

As discussed above, the layers on the slope CD have thinner thickness. This means the designed spectrum would shift toward the shorter wavelength since thin layer in IM for short wavelength has the same phase angle with the thick layer in MN for the long wavelength.

Another effect is normal incident light path entering CD now becomes oblique to the slope CD. According to the coating theory the effective thickness of oblique incidence is the coated thickness times cosine($\theta$) where $\theta$ is the incident angle. This means the effective thickness is less than the coated thickness. Therefore there is another spectrum shift toward the shorter wavelength.

To minimize long wavelength leakage, the system of FIG. 7 positions the photo sensing surface from X to D rather than original C to D where X lies outside the slope LM. As this method reduces the total sensing area slightly, the sensitivity can be compensated by raising the voltage gain in the circuit.

Figure 5:
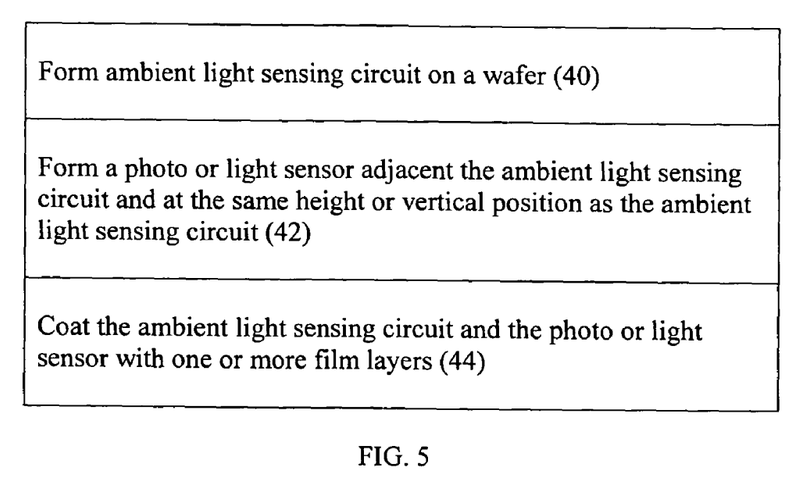
FIG. 5 shows a fourth exemplary process for fabricating a device with ALS.

FIG. 5 shows a fourth exemplary process for fabricating a device with ALS. The process forms an ambient light sensing circuit on a wafer (40). The process also forms an ambient photo or light sensor adjacent the display circuit and at the same height or vertical position as the ambient light sensing circuit (42). This method places the photo sensing surface at the same height as the ambient light sensing circuit surface so there is no shallow effect. This can be done by etching the wafer surface beneath the circuit area before the IC is made, or by padding an insulated layer beneath the photo sensing area. The process then coats the display circuit and the ambient light sensor with one or more film layers (44).

Figure 6:
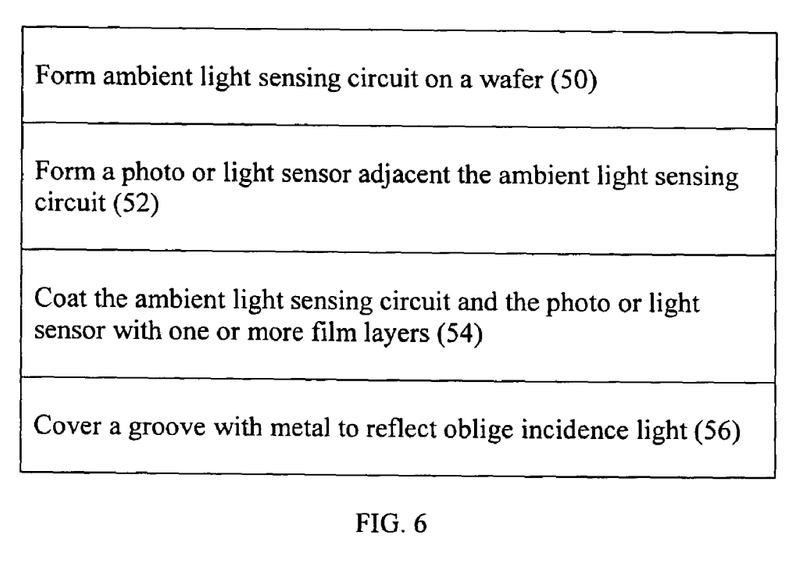
FIG. 6 shows a fifth exemplary process for fabricating a device with ALS.

FIG. 6 shows a fifth exemplary process for fabricating a device with ALS. Again, the process forms an ambient light sensing circuit on a wafer (50) and an ambient light sensor adjacent the display circuit (52). The ambient light sensing circuit and the ambient light sensor are then coated with one or more film layers (54). Next, the process cover a groove between the circuit and the sensor with metal to reflect oblige incidence light (56). The process can cover the grooved area with a layer of metals such as aluminum or gold after the optical coating is finished so the oblige incidence light is totally reflected. This can be done using metal coating and etching in IC manufacturing process, for example.

FIG. 7 shows an exemplary cross-sectional view of one implementation that reduces the area of the photo-sensitive area to reduce or eliminate incident light from being sensed by the photo-sensitive area. In this embodiment, some fringe effects will occur, depending on the amount of reduction of the photo sensitive area. Further, the circuit gain should be increased to compensate for the reduced area. This gain may introduce noise into the system and a noise filter can be needed in one implementation.

Figure 8:
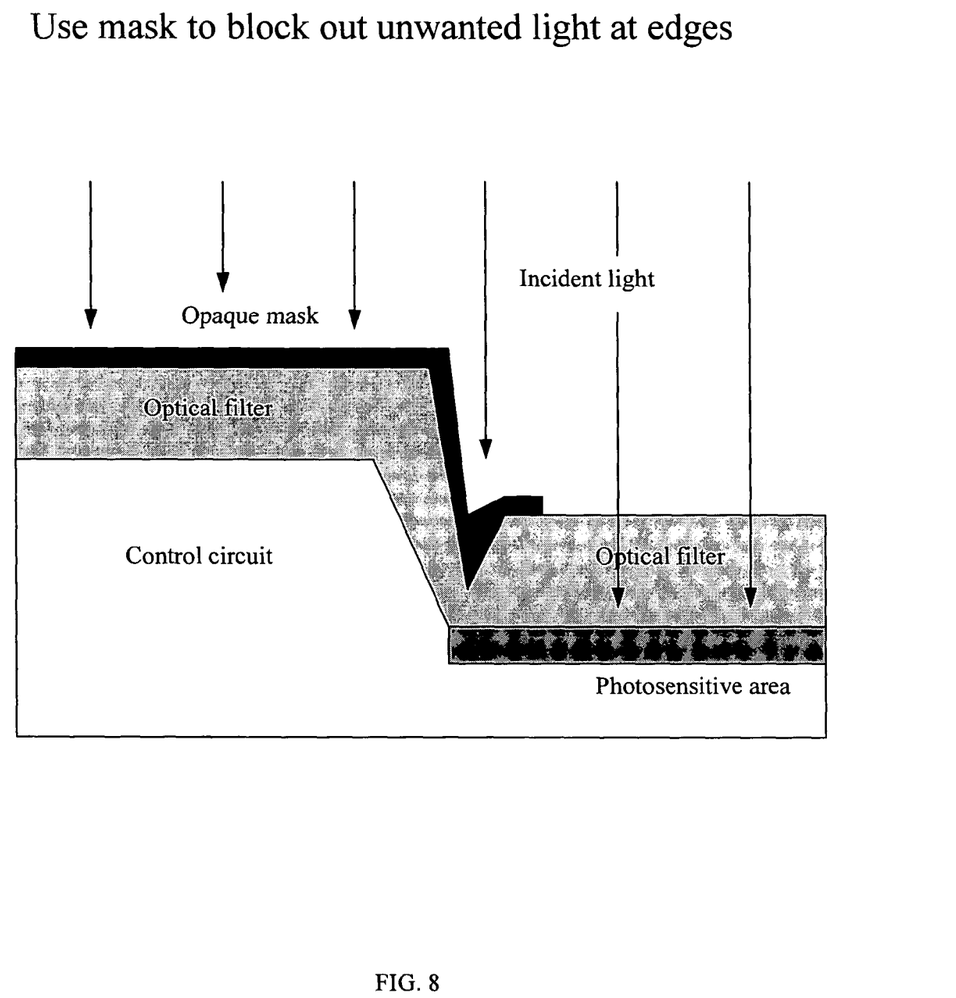

FIG. 8 shows an enhancement to the technique used in FIG. 7. An opaque material, usually a metal such as aluminum is deposited around the edges of the optical filter. This opaque material acts as a barrier to further reduce edge effects. In this implementation, the mask effectively reduces the photosensitive area. Light passes through optical filter. In one implementation, extra process steps such as metallization are needed.

Figure 9:
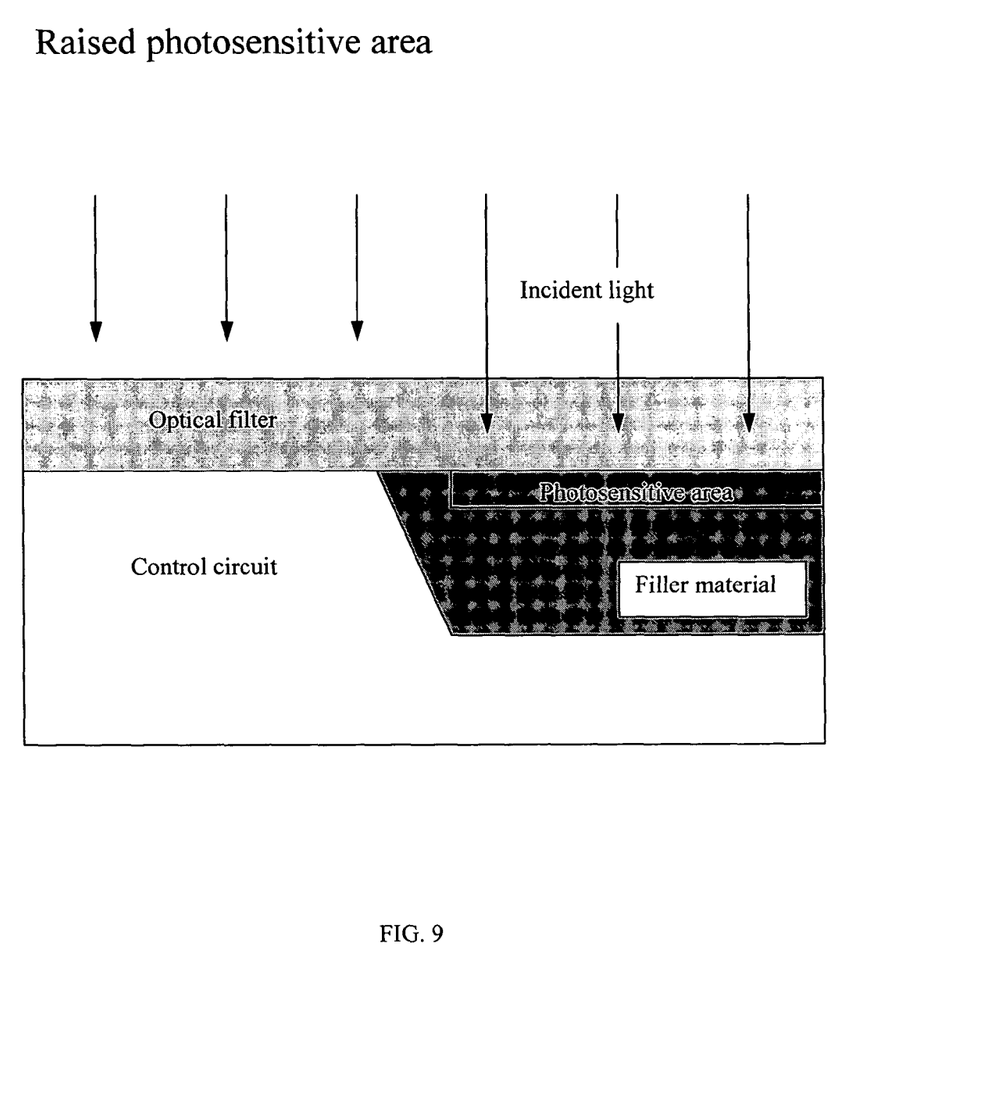
Figure 10:
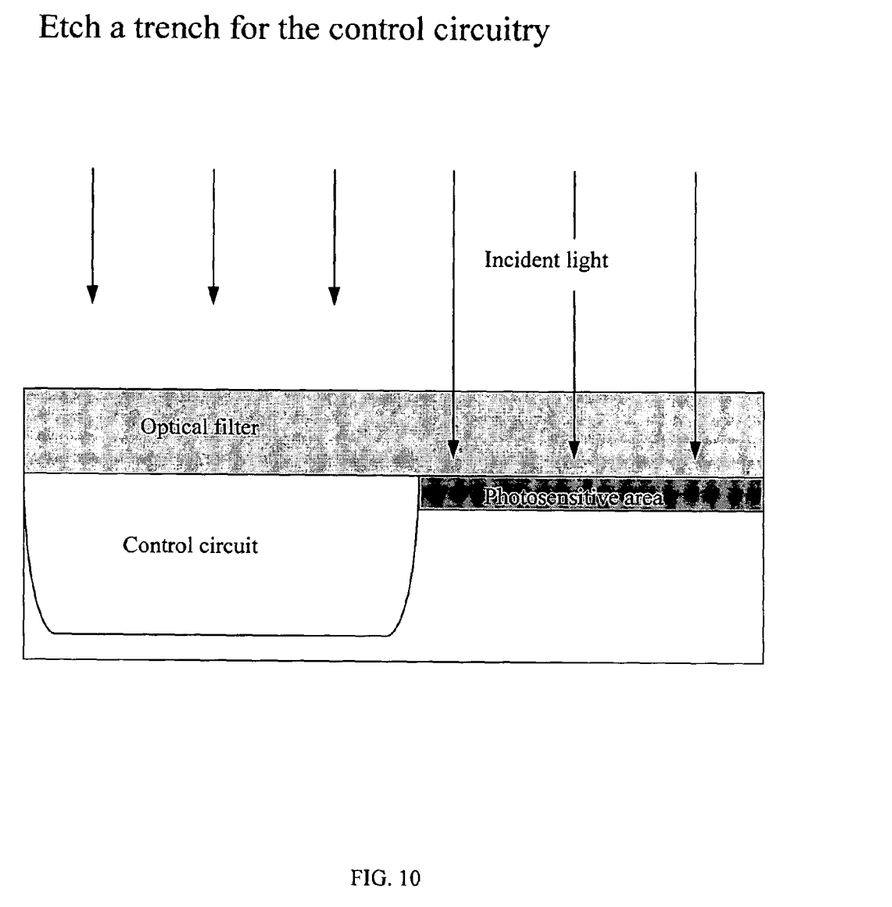

The embodiments of FIGS. 7-8 effectively reduce the photosensitive area. This is undesirable, since light sensitivity is proportional to area. To compensate for reduced area, it is necessary to increase gain. However, increased amplification (gain) also decreases noise margin, since errors are also amplified. Alternative implementations that do not reduce photosensitive area are show in FIGS. 9 and 10. In FIG. 9, a filler material is either deposited or grown on the surface of the wafer to raise the photosensitive area to the same height as the surrounding circuitry. This new surface is then planarized, and an optical filter is deposited on top. The filler is used to eliminate unwanted topology around edges of photosensitive area. In FIG. 10, instead of using a filler material, a trench is etched, and the control circuitry is built inside this trench, so that the edge adjacent to the photosensitive area is planar. During processing, the trench is etched for the control circuitry so the resulting topology is flat.

Figure 11:
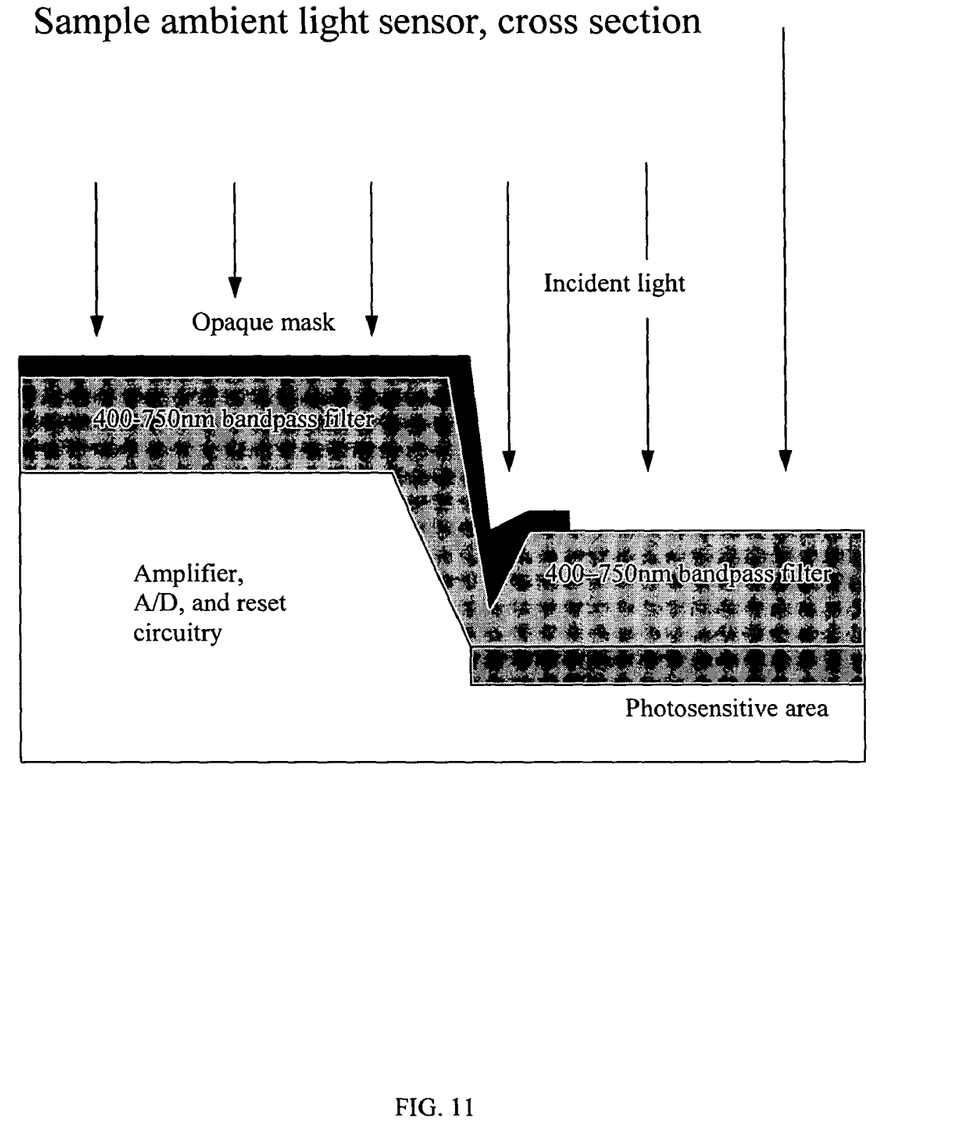

Multiple techniques can also be combined to improve quality of the sensor. For example, a mask can be used in addition to filler material to almost completely eliminate edge effects. This is shown in FIG. 11. For an ambient light sensor, the optical coating is a bandpass filter which passes visible light. The filter typically consists of 40-200 alternating layers of high and low index of refraction material, among others.

The control circuitry typically consists of reset logic, a buffer and amplifier, and an A/D converter. The photosensitive area is a PN junction connected in a reverse-biased manner, and exposed to light. For an ambient light sensor, the optical filter is typically 40-200 layers of alternating high and low index of refraction material. This filter is designed to transmit light with a wavelength of 400-750 nm, and reflect all other wavelengths. In this example, an opaque mask is used to block light in areas with non-planar geometry. This blocks light above the areas where the optical filter is distorted by geometry.

In one exemplary implementation, the ambient light sensor includes a photo or light sensor and a pair of transistors. The photo or light sensor generates an initial current in response to sensed ambient light. The transistor pair is configured as current mirrors to respectively conduct and duplicate the initial current. The second transistor can also provide amplification of the duplicated initial current. For example, the photo or light sensor (e.g., a photodiode or an array of PIN diodes) is connected between an input (or power) terminal (VDD) and a drain terminal of a first transistor. The first transistor can be an n-type MOSFET connected in a diode configuration with a source terminal coupled to ground. The first transistor conducts the initial current generated by the photo or light sensor. The second transistor is also an n-type MOSFET with a source terminal coupled to ground. Gate terminals of the first and second transistors are commonly connected so that the second transistor conducts a second current that follows the initial current and is scaled by the geometric ratios between the first and second transistors.

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A method for fabricating a device, comprising:
   forming a photosensitive area on a wafer;

forming a control circuit adjacent the photosensitive area; and coating the photosensitive area with one or more film layers to form an optical filter said filter providing a reduced leakage of an undesired wavelength onto the photosensitive area;

positioning the photosensitive area at the same height as the control circuit; and etching a wafer surface beneath the control circuit to position the photosensitive area at the same height as the control circuit.

2. The method of claim 1, comprising reducing the leakage by minimizing a topology on and near the photosensitive area.

3. The method of claim 1, wherein the desired wavelength comprises visible light, and wherein the undesired leakage comprises an infrared wavelength.

4. The method of claim 1, wherein the desired wavelength corresponds to one of: red light, green light, blue light.

5. The method of claim 4, wherein the undesired wavelength comprises remaining frequencies detectable by the photosensitive area.

6. The method of claim 1, comprising the filter selectively passes the desired wavelength(s).

7. The method of claim 1, wherein the optical filter rejects wavelength(s) outside a sensitivity range of the photosensitive area.

8. The method of claim 1, comprising providing a separation distance between the photosensitive area and adjacent circuitry.

9. The method of claim 8, comprising providing a separation distance to avoid a shadow effect created by circuit topology.

10. The method of claim 1, wherein the one or more film layers between the control circuit and the photosensitive area form a groove between two planar film layer portions, and wherein the photosensitive area is positioned under one of the planar portions.

11. The method of claim 1, comprising increasing a voltage gain of the light sensor to compensate for a reduced photosensitive area.

12. The method of claim 1, comprising eliminating non-planar topology at one or more edges of the photosensitive area.

13. The method of claim 1, comprising positioning the photosensitive area at the same height as the control circuit.

14. The method of claim 13, comprising padding an area under the photosensitive area to elevate the photosensitive area to the same height as the control circuit.

15. The method of claim 1, wherein an opaque layer is generated at one or more edges of the photosensitive area.

16. The method of claim 1, wherein an opaque layer blocks an area of non-planar topology near or within the photosensitive area.

17. The method of claim 16, wherein the opaque layer consists of a deposited metal.

18. The method of claim 16, comprising depositing a metal during semiconductor fabrication.

* * * * *